(12) United States Patent
Gibbons et al.

(10) Patent No.: US 6,294,733 B1
(45) Date of Patent: Sep. 25, 2001

(54) INDEXING RING PROVIDING AUTOMATIC CONTINUITY

(75) Inventors: Donald G. Gibbons, Raleigh; Jackie C. Sullivan, Knightdale, both of NC (US)

(73) Assignee: Square D Company, Palatine, IL (US)

( * ) Notice: Subject to any disclaimer, the term of this patent is extended or adjusted under 35 U.S.C. 154(b) by 0 days.

(21) Appl. No.: 09/469,925

(22) Filed: Dec. 22, 1999

(51) Int. Cl.$^7$ ............................................ H05K 5/02
(52) U.S. Cl. .............................. 174/51; 174/151
(58) Field of Search ................... 174/51, 65 R, 174/65 G, 151, 152 G, 153 G; 248/56; 16/2.1, 2.2

(56) References Cited

U.S. PATENT DOCUMENTS

| | | | | |
|---|---|---|---|---|
| 5,602,534 | * | 2/1997 | Granat ........................... | 174/51 |
| 5,648,639 | * | 7/1997 | Hand ............................. | 174/51 |
| 6,043,983 | * | 3/2000 | Taylor et al. ................. | 174/51 |
| 6,114,630 | * | 9/2000 | Gretz ............................ | 174/65 R |

* cited by examiner

Primary Examiner—Dean A. Reichard
Assistant Examiner—Angel R. Estrada
(74) Attorney, Agent, or Firm—David R. Stacey; Larry T. Shrout; Larry I. Golden

(57) ABSTRACT

An indexing ring providing automatic continuity between metallic parts of an operator interface device and a support panel in which the operator interface device is mounted. Continuity between the operator interface device and support panel is automatically provided by a continuity rib integrally formed from the indexing feature of an indexing ring. The indexing ring is installed between the operator interface device and the support panel to ensure the relative position of the operator interface device with the support panel. As the indexing feature of the indexing ring is slidably received within the indexing features of the support panel and operator interface device a generally sharp distal edge of the continuity rib will cut through any corrosion protection, such as paint, which might be covering the support panel. Thus, a metal-to-metal connection providing electrical continuity is automatically established and maintained between the operator interface device, indexing ring and the support panel.

19 Claims, 4 Drawing Sheets

US 6,294,733 B1

INDEXING RING PROVIDING AUTOMATIC CONTINUITY

FIELD OF THE INVENTION

The present invention relates to operator interface devices and specifically to automatically maintaining continuity between metallic parts of the operator interface device and a support panel.

BACKGROUND OF THE INVENTION

It is desirable to maintain electrical continuity between the metallic parts of operator interface devices (pushbuttons, key switches, selector switches, etc.) and the support panels in which they are installed. The support panels are usually provided with a coating, such as paint, to protect against corrosion. The protective coating is usually an electrically insulative material, which prevents the establishment of electrical continuity between the operator interface device and the support panel. Continuity has commonly been accomplished by providing dedicated wiring terminals for connecting a wire between the operator interface device and the support panel, or protective coating penetration features which break the protective coating to establish continuity. Both methods have required the operator interface installer to perform specific operations (tightening a screw or torquing a nut) to ensure that continuity between metallic parts of the operator interface and the support panel is established, and then maintained. It is not uncommon for these specific operations to be inadvertently forgotten by the installer, or be of such difficulty or inaccessibility that the operations are deliberately not performed. If the screw or nut should become loose or the force applied to the protective coating penetration feature is reduced, continuity between the metallic parts of the operator interface device and the support panel can be lost. It is therefore desirable that electrical continuity between the metallic parts of the operator interface device and the support panel be established and maintained automatically, without requiring any specific operation by the installer.

SUMMARY OF THE INVENTION

The present invention provides automatic electrical continuity between metallic parts of an operator interface device and a support panel in which the operator interface device in mounted. Continuity between the operator interface and support panel is automatically provided by wedge-shaped continuity ribs integrally formed from the indexing feature of an indexing ring which is placed between the operator interface device and the support panel. No additional wiring, special tools or torquing requirements are needed for the automatic continuity feature of the indexing ring to establish and maintain continuity between the metal parts of the operator interface device and the support panel. The integrally formed continuity ribs are shaped such that upon installation of the indexing ring sharp edges of the continuity ribs will cut through any corrosion protection, such as paint, which might be covering the support panel. The continuity ribs can also cut into the alignment feature of the operator interface device, thereby providing a metal-to-metal connection between the operator interface device, indexing ring and the support panel.

Figure 1:
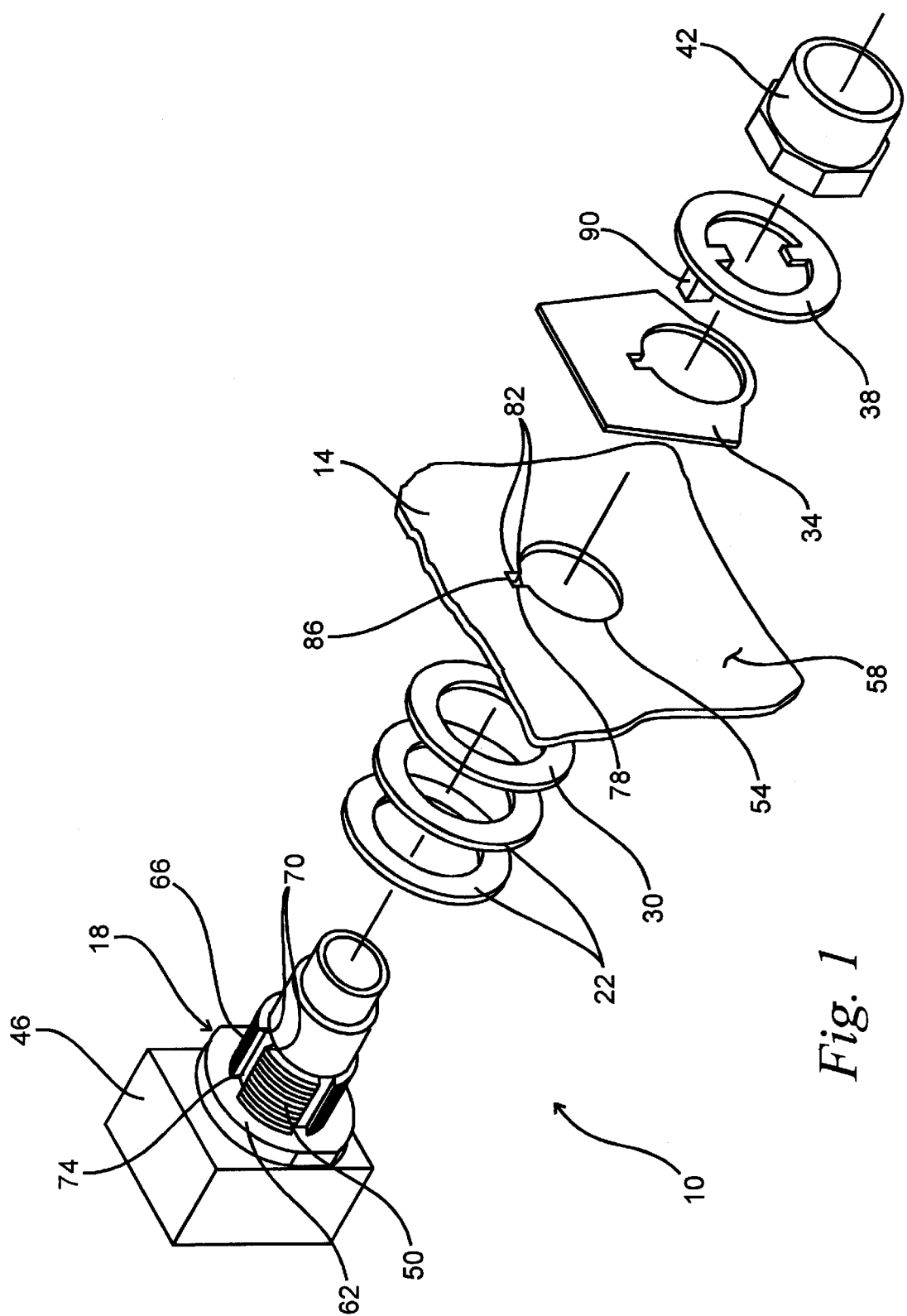
FIG. 1 is an exploded view of an operator interface device illustrating its various parts with respect to a support panel in which it is to be mounted.

Before one embodiment of the invention is explained in detail, it is to be understood that the invention is not limited in its application to the details of construction in the description or as illustrated in the drawings. The invention is capable of other embodiments and of being practiced or being carried out in various other ways. Also, it is to be understood that the phraseology and terminology used herein is for the purpose of description and should not be regarded as limiting.

DETAILED DESCRIPTION OF THE DRAWINGS

FIG. 1 is an exploded view of a typical operator interface device, generally indicated by reference numeral 10, with respect to a support panel 14 in which it is to be installed. The most common parts of the operator interface device 10, as shown in FIG. 1, are the operator interface body 18, spacer washers 22, sealing gasket 30, legend plate 34, indexing ring 38 and ring nut 42. FIG. 1 illustrates the relationship of these parts with respect to the support panel 14. Although other accessories, which are not discussed herein, can be used with the operator interface device 10, the minimum configuration of parts would include the interface body 18, indexing ring 38 and ring nut 42. The interface body 18 generally provides support and protection for the mechanical operating elements (not shown) of the operator interface device 10 such as a pushbutton mechanism a rotatable selector or a key switch. The operator interface body 18 serves as a platform on which the electrical components of the interface device 10, such as a contact block, a pilot light assembly or other electrical component generally indicated by reference numeral 46, can be attached. The operator interface body 18 also provides a means for attaching the operator interface device 10 to the support panel 14. A threaded barrel 50 of the operator interface body 18 passes through a hole 54 defined in the support panel 14 and threadably receives the ring nut 42. It is common to provide a protective coating 58 such as paint to the support panel 14 after punching any required holes 54, thereby protecting all surfaces and edges of the support panel 14 from corrosion. This protective coating 58 is generally a hard, durable, electrical insulator that can prevent the establishing and maintaining of electrical continuity between metal parts of the operator interface device 10 and the support panel 14. The support panel 14 is sandwiched between a generally flat surface 62 of the operator interface body 18 or spacer washers 22, which compensate for various support panel 14 thicknesses, and the indexing ring 38. The ring nut 42 is then threaded onto the threaded barrel 50 to secure the installation. The threaded barrel 50 is provided with at least one indexing slot 66 defined by two generally parallel sides 70 spaced apart by a bottom 74 and the hole 54 of the support panel 14, and is also provided with at least one indexing slot 78 defined by two generally parallel sides 82 spaced apart by a bottom 86. The indexing slots 66 and 78 are dimensioned to snugly but slidably receive an indexing key 90, which is integrally formed from the indexing ring 38.

Figure 2:
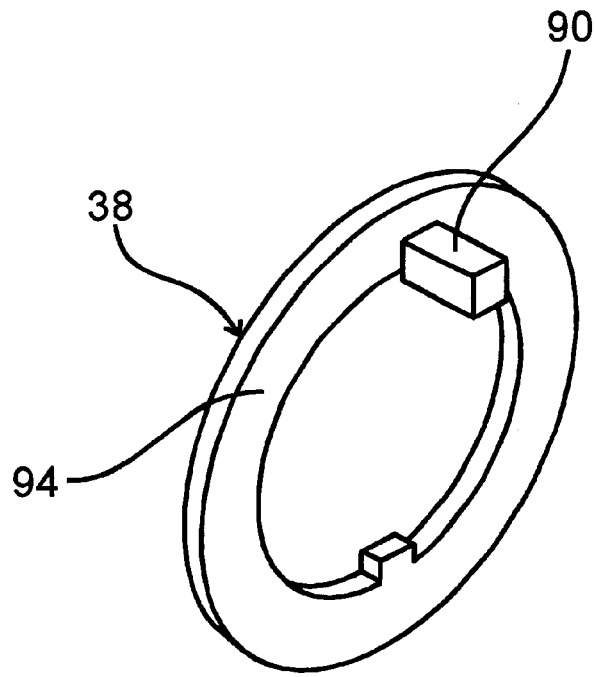
FIG. 2 is an isometric view of an indexing ring of the prior art.

Referring now to FIG. 2, it can be seen that the indexing key 90 extends outwardly from and generally perpendicular to a substantially flat surface 94 of the indexing ring 38 and is generally square or rectangular in cross-section. As the operator interface device 10 is assembled on to the support panel 14, the indexing key 90 slides into the slots 66 and 78 of the threaded barrel 50 and support panel 14, respectively, such that the operator interface body 18 and support panel 14 are interlocked together and can not move angularly (rotate) with respect to one another as the ring nut 42 is tightened. In the prior art assembly as discussed with respect to FIGS. 1 and 2, there is no means provided for automatically establishing and maintaining electrical continuity between metal parts of the operator interface device 10 and the support panel 14 in which it is installed.

Figure 3:
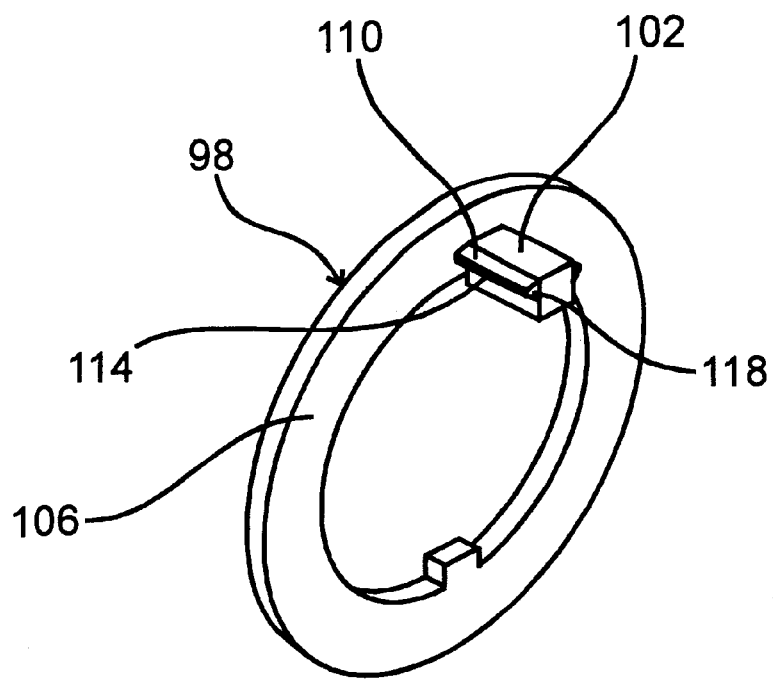
FIG. 3 is an isometric view of an indexing ring manufactured in accordance with the present invention.

Referring now to FIG. 3, an isometric view of an indexing ring 98 manufactured in accordance with the present invention is shown. The indexing ring 98 includes at least one indexing key 102 extending outwardly from and generally perpendicular to a substantially flat surface 106 of the indexing ring 98. The indexing key 102 is generally square or rectangular in cross-section and is dimensioned to be snugly but slidably received in the slots 66 and 78 of the threaded barrel 50 and support panel 14, respectively. Although the preferred cross-sectional shape of the indexing key 102 is either square or rectangular, other cross-sectional shapes can be used. The indexing key 102 includes at least one integrally formed continuity rib 110, extending outwardly along one side of the indexing key 102. The continuity rib 110 is generally wedge-like in cross-section such that a generally sharp distal edge 114 is defined by the continuity rib 110. The continuity rib 110 extends sufficiently outward from the indexing key 102 to ensure that the sharp distal edge 114 will automatically cut through any protective coating 58 applied to the support panel 14 and engage the metal of the support panel 14 as the operator interface device 10 is installed in the support panel 14. In the preferred configuration, one continuity rib 110 is placed on each of two generally parallel and opposite sides 104 of the indexing key 102 such that both sides 70 of the indexing slot 66 are engaged by the two continuity ribs 110. It is also preferred that a leading edge 118 of each continuity rib 110 is generally rounded or beveled to facilitate easy insertion into the indexing slots 66 and 78.

Figure 4:
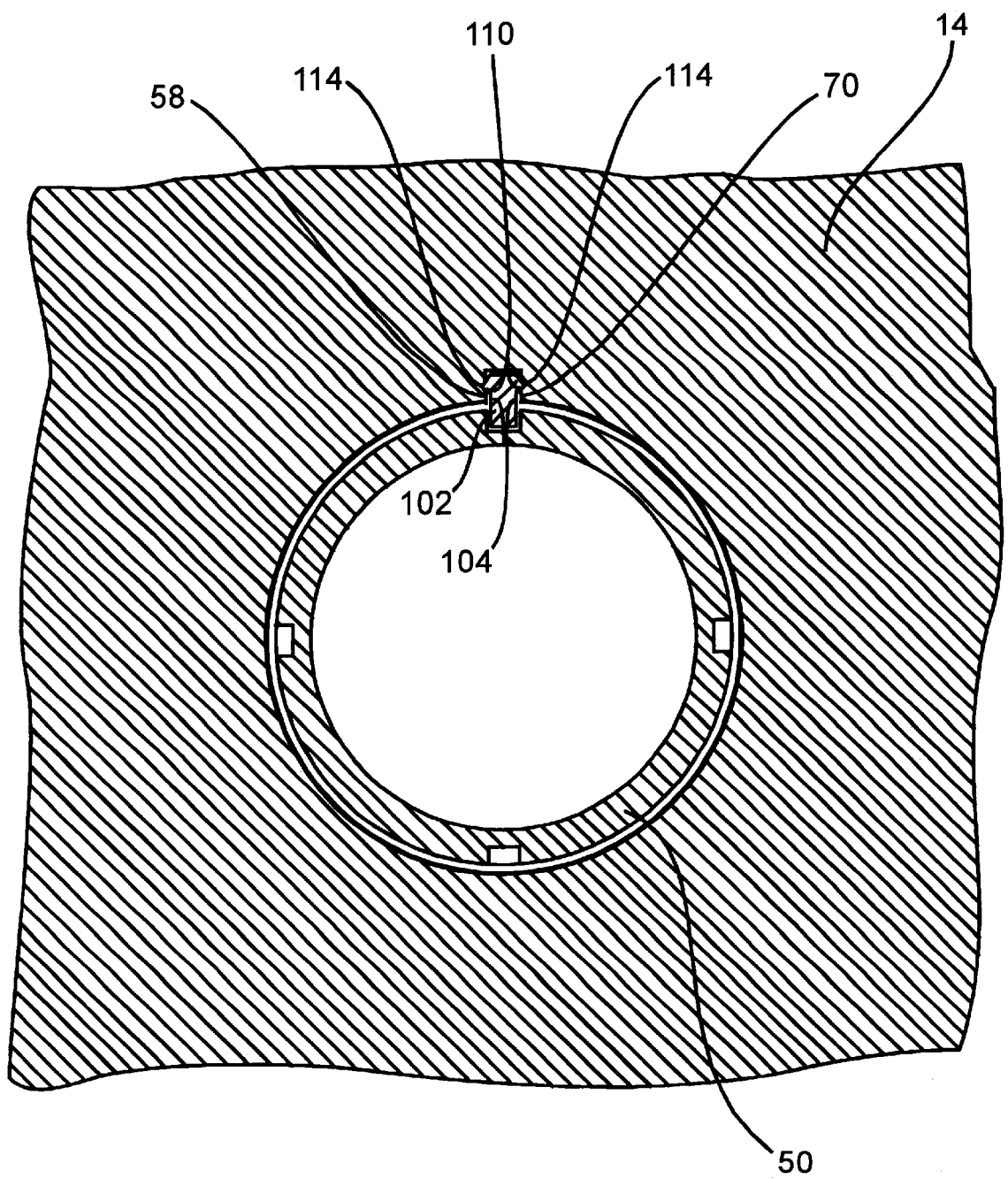
FIG. 4 is cross-sectional view, taken through the plane of the support panel, illustrating the interaction of the automatic continuity feature of the indexing ring of FIG. 3 and a support panel.

FIG. 4 illustrates in cross-section the indexing key 102 of an indexing ring 98 (not shown in cross-section) of the present invention, installed in a support panel 14. In this cross-sectional view, the sharp distal edges 114 of the continuity rib 110 have cut through the protective coating 58 and engaged the metal of the support panel 14. This automatic cutting action of the sharp distal edges 114 establishes and maintains continuity between the indexing ring 98 and the support panel 14, and ultimately between the support panel 14 and the operator interface device 10 through the threaded barrel 50.

Figure 5:
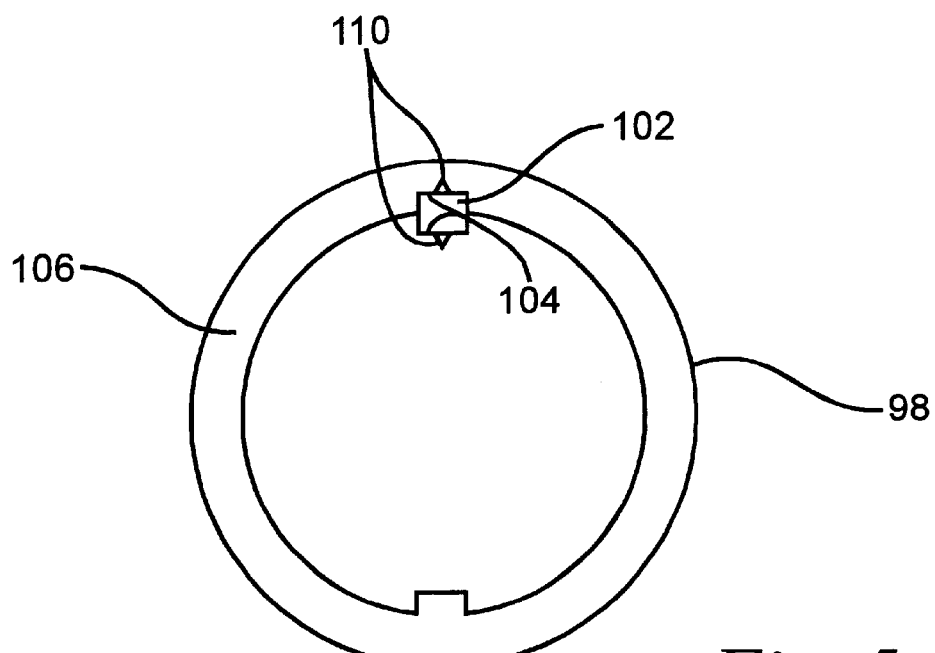
FIG. 5 is a front view of a first alternate construction of an indexing ring manufactured in accordance with the present invention.

FIG. 5 illustrates a second embodiment of an indexing ring 98 manufactured in accordance with the present invention. In this embodiment one continuity rib 110 is placed on each of two opposite sides 104 of the indexing key 102 such that the bottoms 74 and 86 of indexing slots 66 and 78, respectively, (FIG. 1) are engaged by continuity ribs 110. It is within the scope of this embodiment that continuity ribs 110 can be placed on adjacent sides of the indexing key 102 such that one of the sides 82 of indexing slot 78 is engaged by one continuity rib 110 and the bottom 74 of indexing slot 66 is engaged by the other indexing rib 110. It is also within the scope of this embodiment that one continuity rib 110 can be placed on each of two opposite sides 104 of the indexing key 102 at diagonally opposed corners such that one of the sides 70 of indexing slot 66 and one of the sides 86 of indexing slot 78, are engaged by continuity ribs 110.

Figure 6:
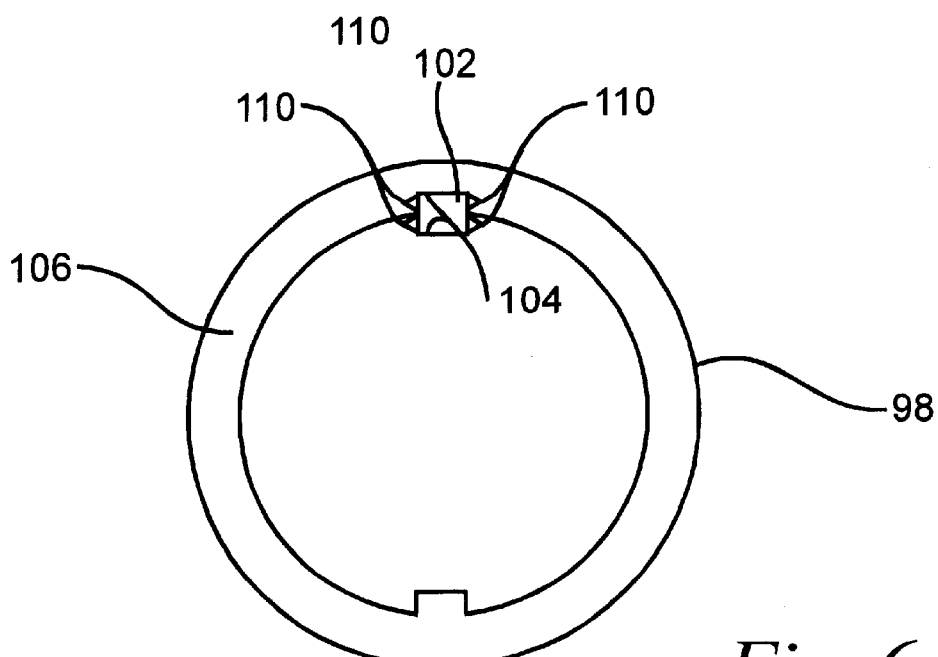
FIG. 6 is a front view of a second alternate construction of an indexing ring manufactured in accordance with the present invention.

FIG. 6 illustrates a third embodiment of an indexing ring 98 manufactured in accordance with the present invention. In this configuration two continuity ribs 110 are positioned on each of two opposite sides 104 of the indexing key 104 such that two opposing sides 70 and 82 or the bottoms 74 and 86 of indexing slots 66 and 78, respectively, (FIG. 1) are engaged by the continuity ribs 110.

What is claimed is:

1. An indexing ring comprising:
   a body having two generally parallel flat sides, said body defining a generally circular aperture;
   an indexing key extending outwardly from and generally perpendicular to one of said generally parallel flat sides, said indexing key dimensioned to be slidably received within an indexing slot associated with a generally circular aperture of a support panel;
   at least one continuity rib extending outwardly from said indexing key along a longitudinal axis of said indexing key, said at least one continuity rib defining a relatively sharp distal edge, said continuity rib extending sufficiently outward from said indexing key such that said relatively sharp distal edge is cuttingly received within the indexing slot of the support panel thereby penetrating any protective coating applied to the support panel and establishing and maintaining electrical continuity between said indexing ring and the support panel.

2. The indexing ring of claim 1 wherein said indexing ring and the support panel are both made of an electrically conductive material such that electrical continuity between said indexing ring and the support panel can automatically be established and maintained when said relatively sharp distal edge of said continuity rib is cuttingly received within the indexing slot of the support panel.

3. The indexing ring of claim 1 wherein said indexing key has at least two generally parallel sides.

4. The indexing ring of claim 3 wherein said at least one continuity rib is integrally formed from at least one of said at least two generally parallel sides of said indexing key.

5. The indexing ring of claim 4 wherein said at least one continuity rib is generally triangular in cross-section.

6. The indexing ring of claim 3 wherein at least one continuity rib is integrally formed from and extends outwardly from each of said at least two generally parallel sides.

7. The indexing ring of claim 3 wherein said at least two generally parallel sides are spaced apart by a second pair of generally parallel sides being generally perpendicular to said at least two generally parallel sides.

8. The indexing ring of claim 7 wherein at least one continuity rib is integrally formed from and extends outwardly from one of said at least two generally parallel sides and at least one continuity rib is integrally formed from and extends outwardly from one of said second pair of generally parallel sides.

9. The indexing ring of claim 1 wherein said at least one continuity rib has a rounded or beveled leading edge for easy insertion into said indexing slot.

10. An indexing ring for indexing an operator interface device having a conductive housing with respect to a support panel constructed of conductive material with an insulative protective coating through which the interface device housing is installed, said indexing ring comprising:

a body having two generally parallel flat sides, said body defining a generally circular aperture sized to slidingly receive a barrel portion of the operator interface device;

an indexing key extending outwardly from and generally perpendicular to one of said generally flat sides, said indexing key dimensioned to be slidably received within an indexing slot associated with a generally circular aperture defined by the support panel and dimensioned to slidably receive the barrel portion of the operator interface device, said indexing key further including an extended portion which extends into said generally circular aperture of said indexing ring, said extended portion being dimensioned to be slidably received within an indexing slot defined in the barrel portion of the operator interface device;

at least one continuity rib extending outwardly from said indexing key along a longitudinal axis of said indexing key, said at least one continuity rib defining a relatively sharp distal edge, said continuity rib extending sufficiently outward from said indexing key such that said relatively sharp distal edge is cuttingly received within the indexing slot of the support panel thereby penetrating any protective coating applied to the support panel and establishing and maintaining electrical continuity between said indexing ring and the support panel.

11. The indexing ring of claim 10 wherein said indexing key has at least two generally parallel sides.

12. The indexing ring of claim 11 wherein said at least one continuity rib is integrally formed from at least one of said at least two generally parallel sides of said indexing key.

13. The indexing ring of claim 12 wherein said at least one continuity rib is generally triangular in cross-section.

14. The indexing ring of claim 11 wherein at least one continuity rib is integrally formed from and extends outwardly from each of said at least two generally parallel sides.

15. The indexing ring of claim 12 wherein said at least two generally parallel sides are spaced apart by a second pair of generally parallel sides being generally perpendicular to said at least two generally parallel sides.

16. The indexing ring of claim 15 wherein at least one continuity rib is integrally formed from and extends outwardly from one of said at least two generally parallel sides and at least one continuity rib is integrally formed from and extends outwardly from one of said second pair of generally parallel sides.

17. The indexing ring of claim 10 wherein said at least one continuity rib has a rounded or beveled leading edge for easy insertion into said indexing slot.

18. The indexing ring of claim 10 wherein said extended portion of said indexing key engages a portion of the indexing slot or the barrel portion of the operator interface device thereby establishing and maintaining electrical continuity between said indexing ring and the operator interface device and ultimately between the support panel and the operator interface device.

19. An apparatus for automatically providing continuity between elements of an operator interface device and a support panel, said apparatus comprising: a body having two generally parallel flat sides, said body defining a generally circular aperture;

an indexing key extending outwardly from and generally perpendicular to one of said generally flat sides, said indexing key dimensioned to be slidably received within an indexing slot associated with a generally circular aperture of the support panel;

at least one continuity rib extending outwardly from said indexing key along a longitudinal axis of said indexing key, said at least one continuity rib defining a relatively sharp distal edge, said relatively sharp distal edge being cuttingly received within the indexing slot of the support panel thereby penetrating any protective coating applied to the support panel and establishing and maintaining electrical continuity between said indexing ring and the support panel.

* * * * *